United States Patent [19]

Chang

[11] Patent Number: 5,581,504
[45] Date of Patent: Dec. 3, 1996

[54] NON-VOLATILE ELECTRICALLY ERASABLE MEMORY WITH PMOS TRANSISTOR NAND GATE STRUCTURE

[75] Inventor: Shang-De T. Chang, Fremont, Calif.

[73] Assignee: Programmable Microelectronics Corp., San Jose, Calif.

[21] Appl. No.: 557,442

[22] Filed: Nov. 14, 1995

[51] Int. Cl.$^6$ .................................................. G11C 11/40
[52] U.S. Cl. ............................ 365/185.17; 365/185.28; 365/185.29; 365/218
[58] Field of Search ...................... 365/185.17, 185.28, 365/185.29, 218

[56] References Cited

U.S. PATENT DOCUMENTS

| | | | |
|---|---|---|---|
| 4,435,790 | 3/1984 | Tickle et al. ............................ | 365/218 |
| 5,369,608 | 11/1994 | Lim et al. ........................ | 365/185.17 X |
| 5,402,373 | 3/1995 | Aritome et al. ............... | 365/185.17 X |
| 5,408,431 | 4/1995 | Challa ................................ | 365/185.17 |

OTHER PUBLICATIONS

Masanori Kikuchi, Shuichi Ohya and Machio Yamagishi, *A New Technique To Minimize The EPROM Cell*, IC Division, Nippon Electric Company, Ltd., 1753, Shimonumabe, Kawasaki, Japan, pp. 181–182.

Dov Frohman–Bentchkowsky, INTEL Corporation, Santa Clara, California, *FAMOS–A New Semiconductor Charge Storage Device*, Solid State Electronics 1974, vol. 17 pp. 517–529.

Constantine A. Neugebauer and James F. Burgess, General Electric Corporation, *Session XV: Programmable Read–Only Memories*, Feb. 18,1977, pp. 184 and 185.

S. Baba, A. Kita and J. Ueda, *Mechanism of Hot Carrier Induced Degradation in MOSFET's*, VLSI R&D Center, Oki Electric Industry Co., Ltd., 1986, pp. 734–737.

*Primary Examiner*—Do Hyun Yoo
*Attorney, Agent, or Firm*—Skjerven, Morrill, MacPherson, Franklin & Friel; William L. Paradice, III

[57] ABSTRACT

A NAND Flash EEPROM string is formed in a common N-well and includes a plurality of P-channel MOS stacked-gate storage transistors and P-channel MOS string and ground select transistors. In the preferred embodiment, each P-channel storage transistor is programmed via hot electron injection from the depletion region proximate its P+ drain/N-well junction and erased via electron tunneling from its floating gate to its P-type channel as well as to its P+ source and P+ drain regions without requiring high programming and erasing voltages, respectively. Further, high P/N junction biases are not required during programming or erasing operations. This allows the dimensions of the present embodiments to be reduced to a size smaller than that of comparable conventional N-channel NAND Flash EEPROM strings.

15 Claims, 3 Drawing Sheets

NON-VOLATILE ELECTRICALLY ERASABLE MEMORY WITH PMOS TRANSISTOR NAND GATE STRUCTURE

CROSS REFERENCE TO RELATED APPLICATIONS

This application is related to the U.S. patent application Ser. No. 08/557,514 entitled "A PMOS Flash Memory Cell Capable of Multi-level Threshold Voltage Storage" U.S patent application Ser. No. 08/557,589 entitled "A PMOS Memory Cell with Hot Electron Injection Programming and Tunnelling Erasing", both filed on Nov. 14, 1995, and U.S. patent application Ser. No. 08/560,249 entitled "PMOS Flash EEPROM Cell with Single Poly", filed on Nov. 21, 1995.

BACKGROUND

1. Field of the Invention

The present invention is related generally to a memory array and specifically to PMOS NAND gate structure.

2. Description of Related Art

A conventional NAND stack ROM includes numerous strings of series connected N-channel bit transistors such as EEPROM storage cells. FIG. 1 shows such a string 10 having eight N-channel storage cells 12a–12h interposed between an N-channel string select transistor 14 and an N-channel ground select transistor 16. String select transistor 14 is coupled between cells 12a–12h and bit line BL of its associated NAND stack array (not shown for simplicity) and has a gate coupled to receive a control signal SS1. Ground select transistor 16 is coupled between cells 12a–12h and ground potential and has a gate coupled to receive a control signal GS1. Typically, each of cells 12a–12h is of a conventional stacked-gate NMOS EEPROM cell structure formed in a common P-well 18, as shown in FIG. 2, having N+ source 20 and drain 22 regions, a floating gate 24, and a control gate 26. The sources of each of cells 12a–12h and select transistors 14, 16 are tied together, as indicated by a common source node 17 in FIG. 1. The control gate of each of cells 12a–12h is coupled to receive a respective one of control signals CG1–CG8.

String 10 may be programmed in either bit, byte, or page mode and may be erased in bulk mode. Referring to FIGS. 1 and 2, to program for instance cell 12h, the gate of string select transistor 14 and common source 17 are pulled to 5V while P-well 18, the gate of ground select transistor 16, and bit line BL are held at ground potential. Cells 12a–12g are turned on by pulling signals SS1 and CG1–CG7 to approximately 12V, thereby pulling drain 22 of cell 12h to 0V. Control gate 26 of cell 12h is pulled to approximately 19V via signal CGS, thereby charging floating gate 24 of cell 12h via electron tunneling. In this manner, the threshold voltage $V_T$ of cell 12h is increased from approximately −2V (in its erased state) to approximately 0.7–1.4 V (in its programmed state).

To read cell 12h, bit line BL is pulled to 3V while common source 17 and P-well 18 are held at ground potential. String select transistor 14, ground select transistor 16, and cells 12a–12g are turned on via the application of 5V to signal lines SS1, GS1, and CG1–CG7, respectively, while control gate 26 of cell 12h is held at ground potential. In this manner, cell 12h will turn off, and thus string 10 will not conduct current, only if floating gate 24 of cell 12h is programmed.

Cells 12a–12h of string 10 are erased in bulk by applying 20V to P-well 18 while bit line BL, common source 17, and the gate of ground select transistor 16 are floating. Signals CG1–CG8 are held at ground, thereby causing electron tunneling from floating gate 24 to P-well 18 of each of respective cells 12a–12h. Typical operating ranges for the bias conditions described above are listed below in Table 1, where cell 12h is the selected cell.

TABLE 1

| Node | Erase | Program Data 0 | Program Unselected Bit line | Read |
|---|---|---|---|---|
| Bit-Line | Floating | 0 V | 5 V | 3 V |
| CS1 | 0 V | 5 V | 5 V | 5 V |
| CG1 | 0 V | 12 V | 12 V | 5 V |
| CG2 | 0 V | 12 V | 12 V | 5 V |
| CG3 | 0 V | 12 V | 12 V | 5 V |
| CG4 | 0 V | 12 V | 12 V | 5 V |
| CG5 | 0 V | 12 V | 12 V | 5 V |
| CG6 | 0 V | 12 V | 12 V | 5 V |
| CG7 | 0 V | 12 V | 12 V | 5 V |
| CG8 | 0 V | 19 V | 19 V | 0 V |
| CG1 | Floating | 0 V | 0 V | 5 V |
| Common Source | Floating | 5 V | 5 V | 0 V |
| P-Well | 20 V | 0 V | 0 V | 0 V |

Cells 12a–12h require high programming and erase voltages and also suffer from read disturb as a result of hot carriers injected into floating gate 24 of cells 12a–12h during read operations. It would thus be desirable to form a NAND stack array which requires less programming and erase voltages, is capable of higher read currents, and which does not suffer from read disturb problems.

SUMMARY

A NAND flash EEPROM cell is disclosed which overcomes problems in the art discussed above. In accordance with the present invention, a NAND string is formed in a common N-well and includes a plurality of P-channel MOS stacked-gate storage transistors and P-channel MOS string and ground select transistors. In the preferred embodiment, each P-channel storage transistor is programmed via hot electron injection from the depletion region proximate its P+ drain/N-well junction and erased via electron tunneling from its floating gate to its P-type channel as well as to its P+ source and P+ drain regions. High programming and erasing voltages, and thus high P/N junction biases, are not required during programming or erasing operations. This allows the dimensions of the string cells to be reduced to a size smaller than that of conventional N-channel NAND Flash EEPROM string cells.

DETAILED DESCRIPTION

Figure 3:
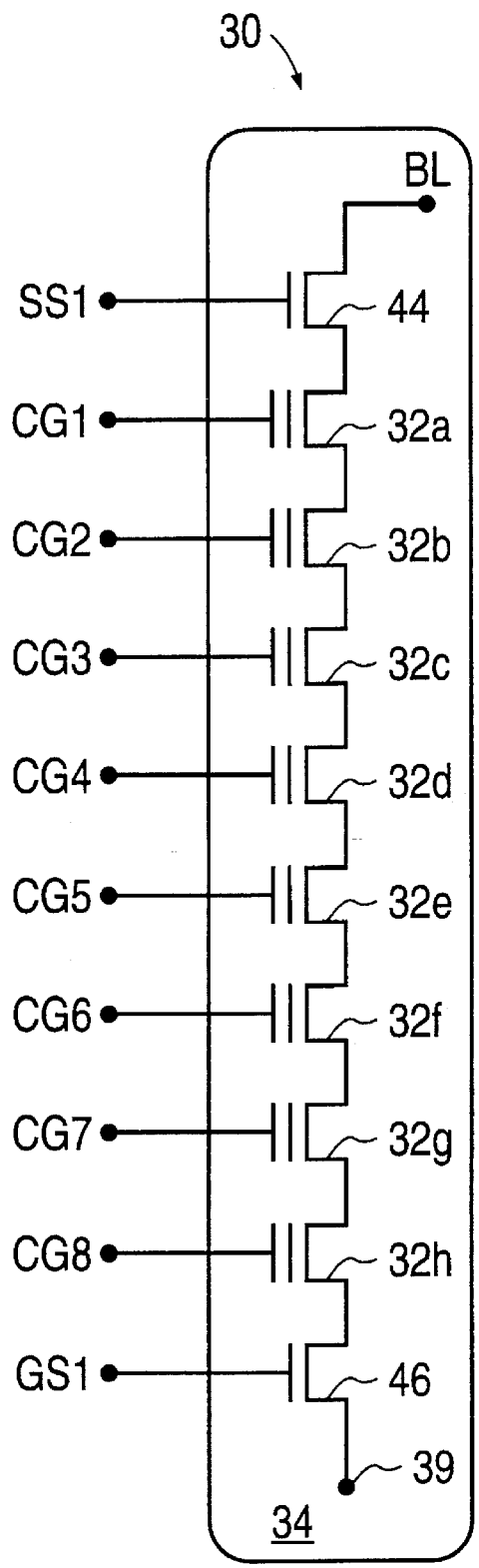
FIG. 3 is a schematic diagram of a PMOS NAND stack string in accordance with the present invention.
Figure 4:
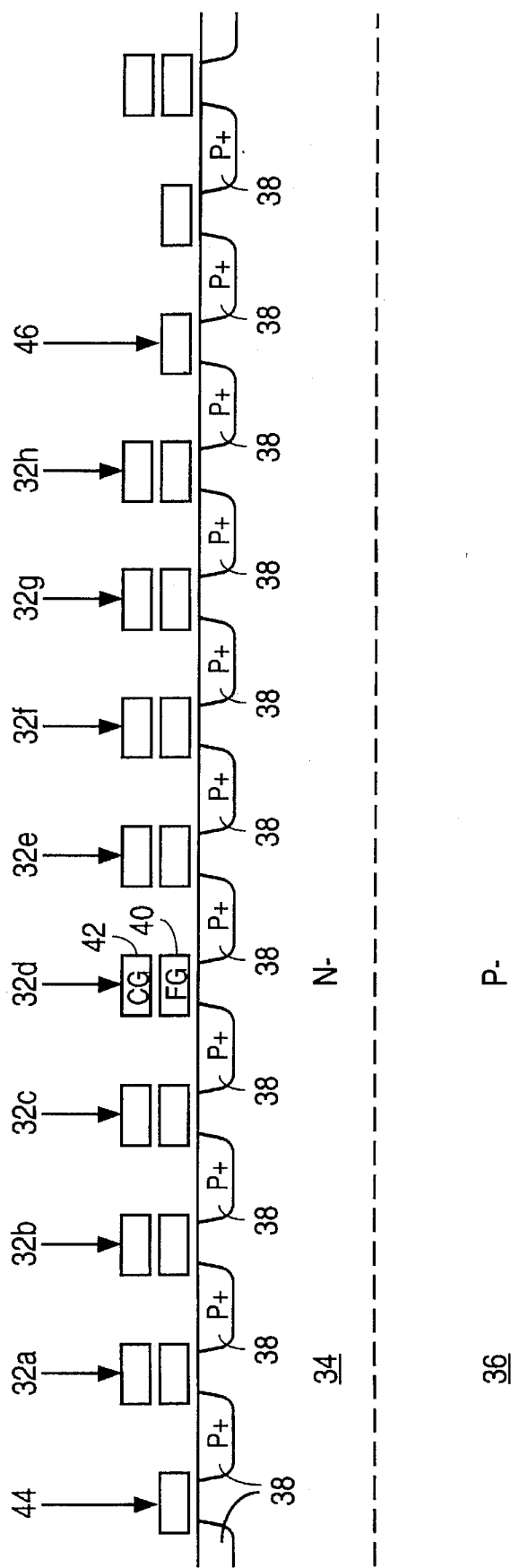
FIG. 4 is a cross-sectional view of the PMOS stack string of FIG. 3.

Referring to FIGS. 3 and 4, a PMOS NAND string 30 having eight P-channel floating gate type cells 32a–32h is in an N-well 34 of a P-type substrate 36. Cells 32a–32h each include P+ source/drain regions 38, a floating gate 40, and a control gate 42, and are connected in series between a P-channel string select transistor 44 having a P+ drain coupled to a bit line BL of an associated memory array (not shown for simplicity) and a P-channel ground select transistor 46. Select transistors 44 and 46 may be any suitable P-channel MOS transistor. The sources of cells 32a–32h and select transistors 44 and 46 are coupled together as indicated by common source node 39 in FIG. 3. Although string 30 is shown to include eight cells 32a–32h, string 30 may in other embodiments include a greater or fewer number of cells 32. Forming a NAND string 30 using P-channel transistors allows string 30 to have numerous advantages over conventional N-channel NAND strings, as will be explained below.

In the preferred embodiment, each of P-channel cells 32a–32h is programmed by hot electron injection from its N-well 34/drain 38 region to its floating gate 40. N-well 34 is held at approximately 8V while approximately 8V and 0V are provided to source 38 and drain 38, respectively. In one embodiment, 12 V is applied to control gate 42. In another embodiment, the voltage on control gate 42 is ramped up from $V_{cc}$ to 12 V. Holes attracted by the less positive drain voltage are swept across the channel region toward drain 38 where they collide with electrons and lattice atoms of N-well 34. The resultant impact ionization near the N-well 34/drain 38 junction generates high energy electrons which are attracted by the positive bias on control gate 42 and are injected into floated gate 40. In this manner, floating gate 40 is charged and the threshold voltage $V_T$ of cell 32 is increased from approximately $-(V_{cc}-1.5)$ V to approximately 4V without an avalanche breakdown of the N-well 34/drain 38 junction. A conventional current limiting device (not shown) should be coupled to bit line BL to prevent the current from exceeding approximately 100 μA, thereby limiting power consumption during programming.

Cell 32 is erased by applying, for instance, 20V to N-well 34 and to P+ source and P+ drain regions 38 while grounding control gate 42. This electrical bias condition causes electrons to tunnel from floating gate 40 to N-well 34. In some embodiments, cells 32a–32h include a tunnel oxide layer overlying N-well 34 which extends over P+ source and P+ drain regions 38, thereby allowing electron tunneling from floating gate 40 to N-well 34 and to P+ source and P+ drain regions 38. Acceptable ranges for programming, erasing, and reading cell 32 are summarized below in Table 2.

TABLE 2

| | Drain voltage | Gate voltage | Source voltage | N-well voltage |
|---|---|---|---|---|
| Program-option 1 | 0 V | $V_{cc}$–16 V | 5 V–15 V | 5 V–15 V |
| Program-option 2 | 0 V | ramped from $V_{cc}$ to 16 V | 5 V–15 V | 5 V–15 V |
| Erase-option 1 | 3 V–15 V | (–3 V)–(–15 V) | 3 V–15 V | 3 V–15 V |
| Erase-option 2 | 15 V–22 V | 0 V | 15 V–22 V | 15 V–22 V |
| Read | less than Vcc | Vcc | Vcc | Vcc |

Figure 2:
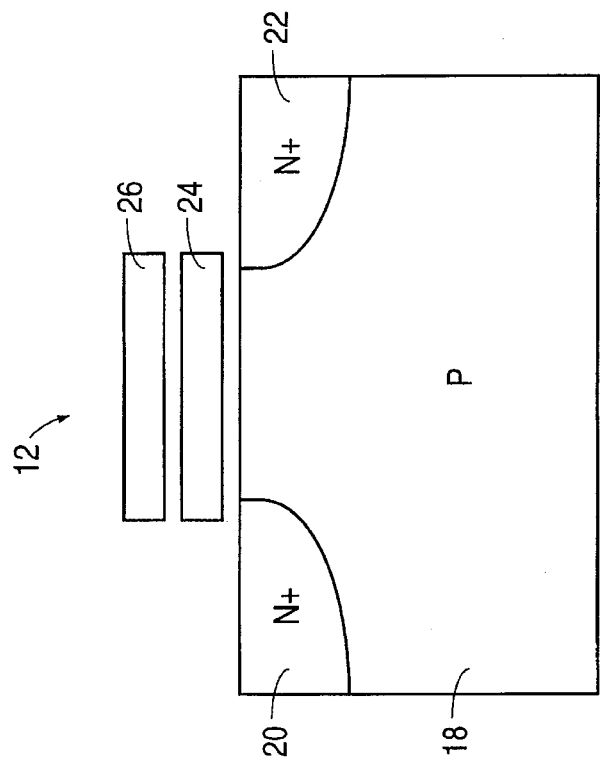
FIG. 2 is a cross-sectional view of a conventional stacked-gate EEPROM cell.
Figure 1:
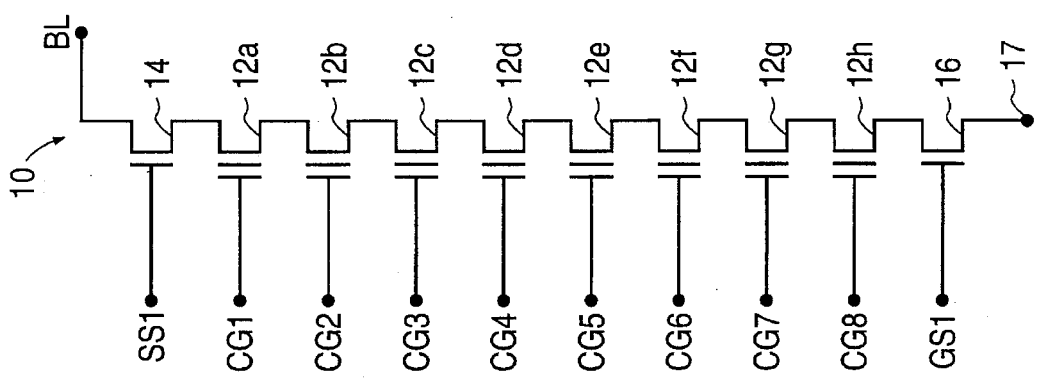
FIG. 1 is a schematic diagram of a conventional NAND stack string.

Thus, to program for instance cell 32h of string 30, N-well 34 and common source node 39 are pulled to approximately 8V while bit line BL and the control gate of select transistor 44 is held at ground potential. The control gate of ground select transistor 46 should be held below approximately 7V. A voltage of approximately 12V (or, in other embodiments, a ramped voltage from $V_{cc}$ to 12V) is applied to control gate 42 of cell 32h to charge floating gate 40 of cell 32h via hot electron injection as described above. Note that NAND string 30 requires a programming voltage of only 12V, which is 7V less than that required to program prior art NMOS NAND string 10 (FIG. 1). Further, NAND string 30 advantageously requires a programming current on the order of only a few μA. Using such a low programming current not only results in a significant reduction in power consumption during programming mode but also allows for page mode programming in approximately 10–100 μs, thereby increasing programming speeds.

Selected ones of string 30 are read by holding common source node 39, N-well 34, and the control gate 42 of the selected one of cells 32a–32h at $V_{cc}$ while grounding the control gates of the remaining ones of cells 32a–32h and select transistors 44 and 46. Bit line BL is then pulled to a voltage less than $V_{cc}$. Unlike cells 12 of prior art NMOS NAND string 10, cells 32a–32h selected for reading will conduct current only if programmed. Thus, since floating gate 40 is already charged, any hot carriers undesirably generated during reading operations will not significantly alter the state of the selected cell. Note that the floating gates of erased ones of cells 32a–32h are of a voltage lower than that of the source 39/N-well 34/drain 38. In this manner, string 30 does not suffer from the read disturb problems existing in convention NMOS NAND strings and is thus being capable of more read cycles. Further, since when programmed cells 32a–32h are in deep depletion, string 30 may advantageously achieve higher read currents than comparable NMOS NAND strings. For instance, a conventional NMOS NAND string having 16 cells typically has a read current of about 7 μA, while a PMOS NAND string having 16 cells 32 in accordance with the present invention has a read current of approximately 15 μA. Accordingly, NAND string 30 is able to achieve faster read speeds.

String 30 is erased by pulling bit line BL, common source node 39, and N-well 34 to approximately 18V and holding the respective control gates of string select transistor 44 and cells 32a–32h at ground potential. The control gate of ground select transistor 46 is held at approximately 18V. Floating gates 40 of cells 32a–32h are thereby discharged via electron tunneling as described above. Acceptable ranges for the bias conditions for programming, erasing, and reading a selected one of cells 32a–32h of string 30 are provided below in Table 3, where cell 32h is the selected cell. Note that since during erase mode the voltage applied to N-well 34 is the same as that applied to P+ source and P+ drain regions 38, there are no high electric fields across the N-well/source and N-well/drain junctions. As a result, hot carriers are not trapped in the tunneling oxide of cells 32a–32h, thereby resulting in a more reliable NAND string.

In other embodiments, groups of strings 30 may be combined in columns to form an array (not shown), where the gates string select transistor 46 and ground select transistor 44 of each string 30 are coupled to receive signals SS1 and GS1, respectively, and the control gates of cells 32a–32g of each string 30 are coupled to receive signals CG1–CG8, respectively. The drain of the string select transistor 46 of each string 30 is coupled to an associated bit line. Thus, referring to Table 3, note that the bit line BL coupled to strings 30 which are not selected for programming are floating.

TABLE 3

| | Program | | | |
|---|---|---|---|---|
| Node | Erase | Data 1 | Un-selected Bit line | Read |
| bit-line | 15–22 V | 0 V | Float | less than Vcc |
| SS1 | 0 V | 0 V | 0 V | 0 V |
| CG1 | 0 V | 0 V | 0 V | 0 V |
| CG2 | 0 V | 0 V | 0 V | 0 V |
| CG3 | 0 V | 0 V | 0 V | 0 V |
| CG4 | 0 V | 0 V | 0 V | 0 V |
| CG5 | 0 V | 0 V | 0 V | 0 V |
| CG6 | 0 V | 0 V | 0 V | 0 V |
| CG7 | 0 V | 0 V | 0 V | 0 V |
| CG8 | 0 V | 5–17 V | 5–17 V | Vcc |
| GS1 | 15–22 V | * | * | 0 V |
| common source | 15–22 V | 5–15 V | 5–15 V | Vcc |
| N-well | 15–22 V | 5–15 V | 5–15 V | Vcc |

*less than common source 39 voltage - 1 V

Note from the discussion above and the bias conditions provided in Table 3 that, unlike conventional string 10, the programming and reading operations of string 30 do not require high biases across P/N junctions within string 30. The absence of such high junction voltages advantageously allows the size of cells 32a–32h of string 30 to be reduced without incurring junction breakdown and junction stress. The elimination of such high junction voltages also results in a more durable and thus more reliable NAND string 30.

In another embodiment, erasing is performed by electron tunneling in a manner similar to that described above except with a negative bias, as indicated below in Table 4, where cell 32h is the selected cell. Note that the bias conditions for unselected ones of string 30 of an array (not shown) are also provided. Erasing string 30 according to the bias conditions listed below in Table 4 allows for a lower voltage operation.

TABLE 4

| | Program | | | |
|---|---|---|---|---|
| Node | Erase | Data 1 | Un-selected Bit line | Read |
| bit line | 5 V–12 V | 0 V | Float | less than Vcc |
| SS1 | 0 V | 0 V | 0 V | 0 V |
| CG1 | (–5) V–(–12) V | 0 V | 0 V | 0 V |
| CG2 | (–5) V–(–12) V | 0 V | 0 V | 0 V |
| CG3 | (–5) V–(–12) V | 0 V | 0 V | 0 V |
| CG4 | (–5) V–(–12) V | 0 V | 0 V | 0 V |
| CG5 | (–5) V–(–12) V | 0 V | 0 V | 0 V |
| CG6 | (–5) V–(–12) V | 0 V | 0 V | 0 V |
| CG7 | (–5) V–(–12) V | 0 V | 0 V | 0 V |
| CG8 | (–5) V–(–12) V | 5–17 V | 5–17 V | Vcc |
| GS1 | 5 V–12 V | * | * | 0 V |
| common source | 5 V–12 V | 5 V–15 V | 5 V–15 V | Vcc |
| N-well | 5 V–12 V | 5 V–15 V | 5 V–15 V | Vcc |

*less than common source 39 voltage –1 V

In yet another embodiment, cells 32a–32h are programmed via electron tunneling and erased by hot electron injection. Operating cells 32a–32h in such a manner, the bias conditions for which are shown below in Table 5, allows for an array of strings 30 to be erased bit-by-bit and programmed in bulk. This operation of string 30 may also be accomplished using a negative bias, as indicated by the bias conditions provided in Table 6, thereby requiring lower voltage operation. In both Tables 5 and 6, cell 32h is the selected cell.

TABLE 5

| | Program | | | |
|---|---|---|---|---|
| Node | Erase | Data 0 | Un-selected Bit line | Read |
| bit line | 0 V | 15 V–22 V | 8 V | less than Vcc |
| SSL | 0 V | 0 V | 0 V | 0 V |
| CG1 | 5 V–15 V | 12 V–17 V | 12 V–17 V | 0 V |
| CG2 | 5 V–15 V | 12 V–17 V | 12 V–17 V | 0 V |
| CG3 | 5 V–15 V | 12 V–17 V | 12 V–17 V | 0 V |
| CG4 | 5 V–15 V | 12 V–17 V | 12 V–17 V | 0 V |
| CG5 | 5 V–15 V | 12 V–17 V | 12 V–17 V | 0 V |
| CG6 | 5 V–15 V | 12 V–17 V | 12 V–17 V | 0 V |
| CG7 | 5 V–15 V | 12 V–17 V | 12 V–17 V | 0 V |
| CG8 | 5 V–15 V | 0 V | 0 V | Vcc |
| GSL | * | 15 V–22 V | 15 V–22 V | 0 V |
| common source | 5 V–15 V | 15 V–22 V | 15 V–22 V | Vcc |
| N-well | 5 V–15 V | 15 V–22 V | 15 V–22 V | Vcc |

*less than common source 39 voltage - 1 V

TABLE 6

| | Program | | | |
|---|---|---|---|---|
| Node | Erase | Data 0 | Un-selected Bit line | Read |
| bit line | 0 V | 5 V–12 V | 0 V | less than Vcc |
| SSL | 0 V | 0 V | 0 V | 0 V |
| CG1 | 5 V–15 V | 0 V | 0 V | 0 V |
| CG2 | 5 V–15 V | 0 V | 0 V | 0 V |
| CG3 | 5 V–15 V | 0 V | 0 V | 0 V |
| CG4 | 5 V–15 V | 0 V | 0 V | 0 V |
| CG5 | 5 V–15 V | 0 V | 0 V | 0 V |
| CG6 | 5 V–15 V | 0 V | 0 V | 0 V |
| CG7 | 5 V–15 V | 0 V | 0 V | 0 V |
| CG8 | 5 V–15 V | –5 V to –12 V | –5 V to –12 V | 0 V |
| GSL | * | 5 V–12 V | 5 V–12 V | Vcc |
| common source | 5 V–15 V | 5 V–12 V | 5 V–12 V | Vcc |
| N-well | 5 V–15 V | 5 V–12 V | 5 V–12 V | Vcc |

*less than common source 39 voltage - 1 V

In yet another embodiment in accordance with the present invention an inhibit voltage may be provided to respective control gates 42 of selected ones of cells 32a–32h to allow for selective erasing of cells 32a–32h. To selectively erase for instance cell 32h in such a manner, bit line BL, the control gate of ground select transistor 46, common source 39, and N-well 34 are pulled high to approximately 18V while the control gate of string select transistor 44 is grounded. Control gate 42 of cell 32h is held at ground potential while control gates 42 of non-selected cells 32a–32g are pulled to approximately 12V. The high voltage on N-well 34 and source and drain regions 38, coupled with the zero voltage on control gate 42 of cell 32h, causes electrons to tunnel from floating gate 40 to N-well 34 of cell 32h and source and drain regions 38 of cell 32h and, thus, returns cell 32h to enhancement mode. The positive voltage on control gates 42 of non-selected cells 32a–32g, however, attracts any electrons stored in respective floating gates 40 sufficiently to inhibit electron tunneling from floating gates 40 of cells 32a–32g, thereby preserving the programming state of non-selected cells 32a–32g. In this manner, individual ones of cells 32a–32g of string 30 may be selectively erased.

The bias conditions for the just described selective erasing operation of string 30, as well as those for programming and reading, are listed below in Table 7, where cell 32h is the selected cell. Note that since programming is accomplished via hot electron injection, as indicated in Table 7 and described earlier, programming is also selective. Thus, operation of string 30 in accordance with the bias conditions listed in Table 7 advantageously allows string 30 to be selectively programmed and selectively erased.

TABLE 7

| Node | Erase | | Program | | Read |
|---|---|---|---|---|---|
| | Unselected Bit line | | Data 1 | Data 0 | |
| bit line | 7 V–9 V | 15 V–22 V | 0 V | Floating | less than Vcc |
| SS1 | 0 V | 0 V | 0 V | 0 V | 0 V |
| CG1 | 5 V–15 V | 5 V–15 V | 0 V | 0 V | 0 V |
| CG2 | 5 V–15 V | 5 V–15 V | 0 V | 0 V | 0 V |
| CG3 | 5 V–15 V | 5 V–15 V | 0 V | 0 V | 0 V |
| CG4 | 5 V–15 V | 5 V–15 V | 0 V | 0 V | 0 V |
| CG5 | 5 V–15 V | 5 V–15 V | 0 V | 0 V | 0 V |
| CG6 | 5 V–15 V | 5 V–15 V | 0 V | 0 V | 0 V |
| CG7 | 5 V–15 V | 5 V–15 V | 0 V | 0 V | 0 V |
| CG8 | 0 V | 0 | 5 V–17 V | 5 V–17 V | Vcc |
| GS1 | 15 V–22 V | 15 V–22 V | * | * | 0 V |
| common source | 15 V–22 V | 15 V–22 V | 5 V–15 V | 5 V–15 V | Vcc |
| N-well | 15 V–22 V | 15 V–22 V | 5 V–15 V | 5 V–15 V | Vcc |

*less than common source 39 voltage - 1 V

In another embodiment, selective erasing may performed using a negative bias, as indicated by the bias conditions listed below in Table 8, thereby allowing for a lower voltage operation (where cell 32h is the selected cell).

TABLE 8

| Node | Erase | | Program | | Read |
|---|---|---|---|---|---|
| | Un-selected Bit line | Data 0 | Data 1 | Un-selected Bit line | |
| bit line | 0 V | 5 V–12 V | 0 V | Floating | less than Vcc |
| SS1 | 0 V | 0 V | 0 V | 0 V | 0 V |
| CG1 | 0 V | 0 V | 0 V | 0 V | 0 V |
| CG2 | 0 V | 0 V | 0 V | 0 V | 0 V |
| CG3 | 0 V | 0 V | 0 V | 0 V | 0 V |
| CG4 | 0 V | 0 V | 0 V | 0 V | 0 V |
| CG5 | 0 V | 0 V | 0 V | 0 V | Vcc |
| CG6 | 0 V | 0 V | 0 V | 0 V | 0 V |
| CG7 | 0 V | 0 V | 0 V | 0 V | 0 V |
| CG8 | −5 to −12 V | −5 to −12 V | 5 V–17 V | 5 V–17 V | 0 V |
| GS1 | 5 V–12 V | 5 V–12 V | * | * | 0 V |
| common source | 5 V–12 V | 5 V–12 V | 5 V–15 V | 5 V–15 V | Vcc |
| N-well | 5 V–12 V | 5 V–12 V | 5 V–15 V | 5 V–15 V | Vcc |

*less than common source 39 voltage - 1 V

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

I claim:

1. A PMOS NAND memory string formed in an N-well, said string comprising:

a P-channel string select transistor having a drain coupled to a bit line and having a source and a gate;

a P-channel ground select transistor having a source, a drain, and a gate; and a plurality of series connected P-channel floating gate memory cells each having a source, a drain, and a control gate and being connected between said drain of said ground select transistor and said source of said string select transistor.

2. The PMOS NAND memory string of claim 1 wherein said sources of said cells, said source of said string select transistor, and said source of said ground select transistor are commonly coupled, thereby resulting in a common source.

3. The PMOS NAND memory string of claim 1 wherein each of said P-channel floating gate memory cells is programmed by hot electron injection from a region of said N-well proximate to said drain of said cell into said floating gate of said cell.

4. The PMOS NAND memory string of claim 1 wherein each of said P-channel floating gate memory cells is erased by the tunneling of electrons from said floating gate to said N-well and to said source and said drain of said cell.

5. The PMOS NAND memory string of claim 4 wherein each of said cells is erased without application of a high bias between said N-well and said drain of said cell.

6. The PMOS NAND memory string of claim 2 wherein a selected one of said cells is programmed by applying approximately 5–15 volts to said N-well and to said common source, grounding said bit line and said gate of said string select transistor, applying approximately 0–14 volts to said gate of said ground select transistor, and applying approximately 5–17 volts to said control gate of said selected one of said cells while grounding said control gates of the remaining cells, thereby causing a channel current induced hot electron injection from a junction of said N-well and said drain of said selected one of said cells into said floating gate of said selected one of said cells.

7. The PMOS NAND memory string of claim 2 wherein said cells are erased by applying approximately 15–22 volts to said common source, to said N-well, to said bit line, and to said gate of said ground select transistor while grounding said control gates of said cells and said gate of said string select transistor to thereby cause the tunneling of electrons from said floating gates of said cells to said N-well and to said sources and drains of respective ones of said cells.

8. The PMOS NAND memory string of claim 2 wherein said cells are erased by applying approximately 5–12 volts to said common source, to said N-well, to said bit line, and to said gate of said ground select transistor while applying approximately −5 to −12 volts to said control gates of said cells and said gate of said string select transistor to thereby cause the tunneling of electrons from said floating gates of said cells to said N-well and to said sources and drains of respective ones of said cells.

9. The PMOS NAND memory string of claim 2 wherein a selected one of said cells is read by applying a first voltage to said common source, to said N-well, and to said control gate of said selected one of said cells, applying a second voltage to said bit line, and grounding said control gates of the remaining cells.

10. The PMOS NAND memory string of claim 9 wherein said second voltage is less than said first voltage.

11. The PMOS NAND memory string of claim 2 further comprising a current limiting device coupled to said bit line, said current limiting device preventing limiting current flow to approximately 100 μA.

12. The PMOS NAND memory string of claim 1 wherein each of said cells has a threshold voltage, when said floating gate is uncharged, of approximately −0.4 to −4 volts.

13. The PMOS NAND memory string of claim 1 wherein each of said cells has a threshold voltage, when in an erased state, between zero volts and a supply voltage.

14. The PMOS NAND memory string of claim 13 wherein said supply voltage is between approximately 0.9 and 5 volts.

15. The PMOS NAND memory string of claim 1 wherein each of said cells has a threshold voltage, when in a programmed state, greater than zero volts.

* * * * *